US006943601B2

(12) United States Patent
Wiedmann (10) Patent No.: US 6,943,601 B2
(45) Date of Patent: Sep. 13, 2005

(54) METHOD AND DEVICE FOR PHASE DETECTION

(75) Inventor: Frank Wiedmann, Freising (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/357,320

(22) Filed: Feb. 3, 2003

(65) Prior Publication Data

US 2003/0155946 A1 Aug. 21, 2003

(30) Foreign Application Priority Data

Feb. 15, 2002 (DE) .......................................... 102 06 370

(51) Int. Cl.$^7$ ................................................ H03D 3/24
(52) U.S. Cl. ...................... 327/158; 331/1 A; 375/376; 327/2
(58) Field of Search ................................ 327/156, 157, 327/146, 158, 2; 331/1 A, 12, 25; 375/371, 374, 376

(56) References Cited

U.S. PATENT DOCUMENTS

| | | | | |
|---|---|---|---|---|
| 5,220,206 A | * | 6/1993 | Tsang et al. ................. | 327/544 |
| 5,408,200 A | * | 4/1995 | Buhler ........................ | 331/1 A |
| 5,633,899 A | * | 5/1997 | Fiedler et al. ............... | 375/376 |
| 5,818,270 A | * | 10/1998 | Hamza ........................ | 327/116 |
| 6,304,116 B1 | * | 10/2001 | Yoon et al. .................. | 327/158 |
| 6,456,128 B1 | * | 9/2002 | Nakamura .................... | 327/149 |

FOREIGN PATENT DOCUMENTS

JP  10022823 A  1/1998

OTHER PUBLICATIONS

"CMOS DLL–Based 2–V 3.2–ps Jitter 1 GHz Clock Synthesizer and Temperature–Compensated Tunable Oscillator", Foley, D.J., Flynn, M.P., Solid–State Circuits, IEEE Journal of, vol. 36, No. 3, Mar. 2001, pp. 417–423.

"A Dual–Loop Delay–Locked Loop Using Multiple Voltage—Controlled Delay Lines", Yean–Jae Jung, SeungWook Lee, Daeyun Shim, Womchan Kim, Shanghyun Kim, Soo–In Cho, Solid–State Circuits, IEEE Journal of, vol. 36, No. 5, May 2001, pp. 784–791.

* cited by examiner

*Primary Examiner*—Dinh T. Le
(74) *Attorney, Agent, or Firm*—Workman Nydegger (57) ABSTRACT

A phase detection system is used in particular in a Delay-Locked Loop (DLL) to generate, as a function of phase differences of different signals (1, 2, 3), at least one control signal for changing the phase delay of phase delay elements (8, 9) in order to obtain a defined phase delay between the signals (1, 2, 3). For this purpose, an up signal for increasing the phase delay and a down signal for reducing the phase delay are advantageously generated, both of which signals act on a charge pump (21) the output signal of which can be used to control the phase delay elements (8, 9). To be able to control even very small phase differences, the up signal and the down signal are generated in such a way that in the steady oscillating state they simultaneously adopt their active switching state for a certain duration during each period. To obtain good control performance of the phase delay of the two phase delay elements (8, 9), in particular even at high frequencies, the up signal and the down signal are generated according to the invention in such a way that in the steady oscillating state, i.e. when the phase delay of both phase delay elements (8, 9) corresponds to the reference phase delay, they each adopt their active switching state for at least one-quarter of the period duration of an input signal (1). The up signal and the down signal are preferably generated by a circuit arrangement of logic gates (10–19, 22–32).

18 Claims, 6 Drawing Sheets

FIG 8 ns is incorporated herein by specific reference.

METHOD AND DEVICE FOR PHASE DETECTION

CROSS-REFERENCE TO RELATED APPLICATIONS

This application claims priority to German application No. DE 102 06 370.2, filed Feb. 15, 2002, which applications is incorporated herein by specific reference.

BACKGROUND OF THE INVENTION

1. The Field of the Invention

The present invention relates to a method and a device for parallel control of two phase delay elements connected in series, two phase control signals for increasing or decreasing the phase delay of the two phase delay elements being generated as a function of the input signals and the output signals of the two phase delay elements.

2. The Relevant Technology

Methods and devices of this kind are used in particular in a Delay-Locked Loop (DLL) in which the phase delay of phase delay elements is controlled to match a certain reference value by means of a control process in order to generate at least one delay signal which is phase-delayed in a defined manner with respect to an input signal. An important component of this process is phase detection, by means of which the phase control signals for driving the phase delay elements are generated as a function of the actual phase delay of the phase delay elements. Two types of phase detection exist. The first type is binary phase detection, using an output signal of constant amplitude the polarity of which changes as a function of whether the phase difference at the input is positive or negative. The second type is linear phase detection, in which the amplitude of the output signal is proportional to the phase difference at the input. The second type is preferable in principle because it makes possible a rapid approach to the steady oscillating state in combination with stable, smooth behavior in the steady oscillating state itself, in which the phase difference at the input becomes very small.

There are, in principle, two methods by which linear phase detection can be realized. The first is based on a state machine with flip-flops as state storage devices, as are also used for a phase frequency detector in a Phase-Locked Loop (PLL). When this method is used, however, there is the fundamental problem with the DLL that, through an incorrect start condition or a missing signal during operation, the phase frequency detector can reach a state in which it supplies false signals, as a result of which the DLL seeks to move towards a different stable state than the one desired. Because only the delay is controlled in the DLL and not the frequency, as in the case of the PLL, a phase frequency detector of this type in a DLL cannot autonomously release itself from this state. Additional circuits are therefore needed to recognize such a state and make control interventions, necessitating a certain complexity and cost. An example of such a method is described in "CMOS DLL-based 2-V 3.2-ps jitter 1 GHz clock synthesizer and temperature-compensated tunable oscillator", Foley, D. J., Flynn, M. P., Solid-State Circuits, IEEE Journal of, Vol. 36, No. 3, March 2001, pp. 417–423.

The second method for realizing linear phase detection consists in using only logic gates and no state storage devices. In a PLL, this method has the disadvantage that, unlike the phase frequency detector based on a state machine, it functions only for small frequency differences between the two input signals. In a DLL, by contrast, all signals always have the same frequency since in this case only the delay is controlled, so that a pure phase detector is sufficient. In this case, the realization using only logic gates without state storage devices has the advantage that false states cannot occur in the first place and the necessary additional cost of circuitry for recognition and correction is eliminated.

A phase detection system generally supplies two phase control signals, an up signal to increase the delay of the phase delay elements and a down signal to reduce the delay of the phase delay elements. As a rule, both signals act on a charge pump. This consists of switchable current sources which during the switched-on period apply a charge to a capacitor or drain it from same, thereby changing the control voltage for the phase delay elements. Because the current sources cannot switch on and off with unlimited speed and because it is nevertheless desired to control even very small phase differences, in the steady oscillating state both the up signal and the down signal are as a rule switched on simultaneously for a certain duration during each period. The difference between the two switched-on durations, which in principle can be as small as desired, then corresponds to the effective control signal.

An example of a phase detection system of this kind is described in "A dual-loop delay-locked loop using multiple voltage-controlled delay lines", Yeon-Jae Jung, Seung-Wook Lee, Daeyun Shim, Wonchan Kim, Changhyun Kim, Soo-In Cho, Solid-State Circuits, IEEE Journal of, Vol. 36, No. 5, May 2001, pp. 784–791. Here, the up signal and the down signal are switched on simultaneously for one-eighth of the period duration in the steady oscillating state. Such a method is useful at relatively low frequencies in which this switched-on duration, which is short in relation to the period duration, is still sufficiently long not to cause problems through the limited switching on and off speed of the charge pump. A short switched-on duration also helps to save current if current flows in the charge pump only when the up signal or the down signal is switched on.

BRIEF SUMMARY OF THE INVENTION

It is, therefore, an object of the present invention to provide a method and a device for controlling phase delay elements of the above-mentioned type in which control is improved in particular at high frequencies.

According to the invention, the two phase delay elements are connected in series and are triggered in parallel by means of the two phase control signals, so that the phase control signals give rise to the same phase delays in both phase delay elements. It is thereby achieved that the second delay signal is delayed with respect to the first delay signal by the same phase difference as the first delay signal is delayed with respect to the input signal, and that the phase position of the first delay signal is located midway in time between the phase positions of the input signal and of the second delay signal.

The two phase delay elements are generally arrangements for phase delay. As a rule, the phase delay elements are themselves built up from a plurality of identical phase delay devices in order also to generate, for example, phase delays of different fractions of one-quarter of the period duration.

In general, the series connection can be realized from the two phase delay elements as a chain of identical phase delay devices in which the input signal is supplied at the start, the first delay signal is tapped at the centre and the second delay signal is tapped at the end, a reference phase difference existing between these signals in the steady oscillating state.

In their active switching state, the two phase delay signals cause an increase or decreases in the phase difference between the two phase delay elements, for which purpose the two phase control signals preferably act on a charge pump the output of which outputs a corrective signal for triggering the phase delay elements. Because in the steady oscillating state, in which the phase delay of the phase delay elements corresponds to the reference phase delay, the two phase control signals are in the active switching state for at least one-quarter and in particular one-half of the period duration of the input signal during each period of the input signal, an adverse influence of insufficient switching speed of the charge pump on the control performance is reduced. In this way, good control performance can be ensured especially at high frequencies. In addition, a large correction reserve is obtained in both triggering directions, i.e. in the direction of both rising and falling phase delay of the phase delay elements.

The two phase control signals are preferably generated in such a way that the active switching states of the two phase control signals are symmetrical to each other in time. In this way, very low waviness or no waviness of the output signal of the charge pump is ensured both in the case of unequally long switching states of the two phase control signals and also in the steady oscillating state.

If the durations of the active switching states of the two phase control signals change in opposite directions in case of deviations from the reference phase delay, an especially high lift of the output signal of the charge pump is generated which can be used to align the phase delay elements. As soon as the phase delay of the two phase delay elements falls below the reference phase delay, the up signal to raise the phase delay is lengthened and the down signal to lower the phase delay is shortened, and vice versa. In this case, it can preferably be provided that in case of deviation of the phase delay from the reference phase delay the duration of the active switching state of one phase control signal is lengthened by the same amount as the duration of the active switching state of the other phase control signal is shortened.

The durations of the respective switching states of the phase control signals are, in principle, generated as a function of the relative phase positions of the input signal and the two delay signals, or of the relative time positions of their slopes. For this reason the two phase control signals can be generated, for example, by measurements of the time intervals between appropriate slopes of the input signal and of the two delay signals.

Preferably, however, the two phase control signals are generated by means of a logic unit which establishes the appropriate logical connections between the input signal and the two delay signals.

A logic unit of this kind can be, for example, a Programmable Logic Device (PLD) or can be built up from individual logic gates, which can be realized in known fashion by means of individual transistors and diodes which are connected in the form of basic logic circuits. In the latter case, all the components needed to produce the required logical connection can be integrated together on a substrate or semiconductor.

The invention is elucidated in more detail below with reference to preferred embodiments and to the appended drawings.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
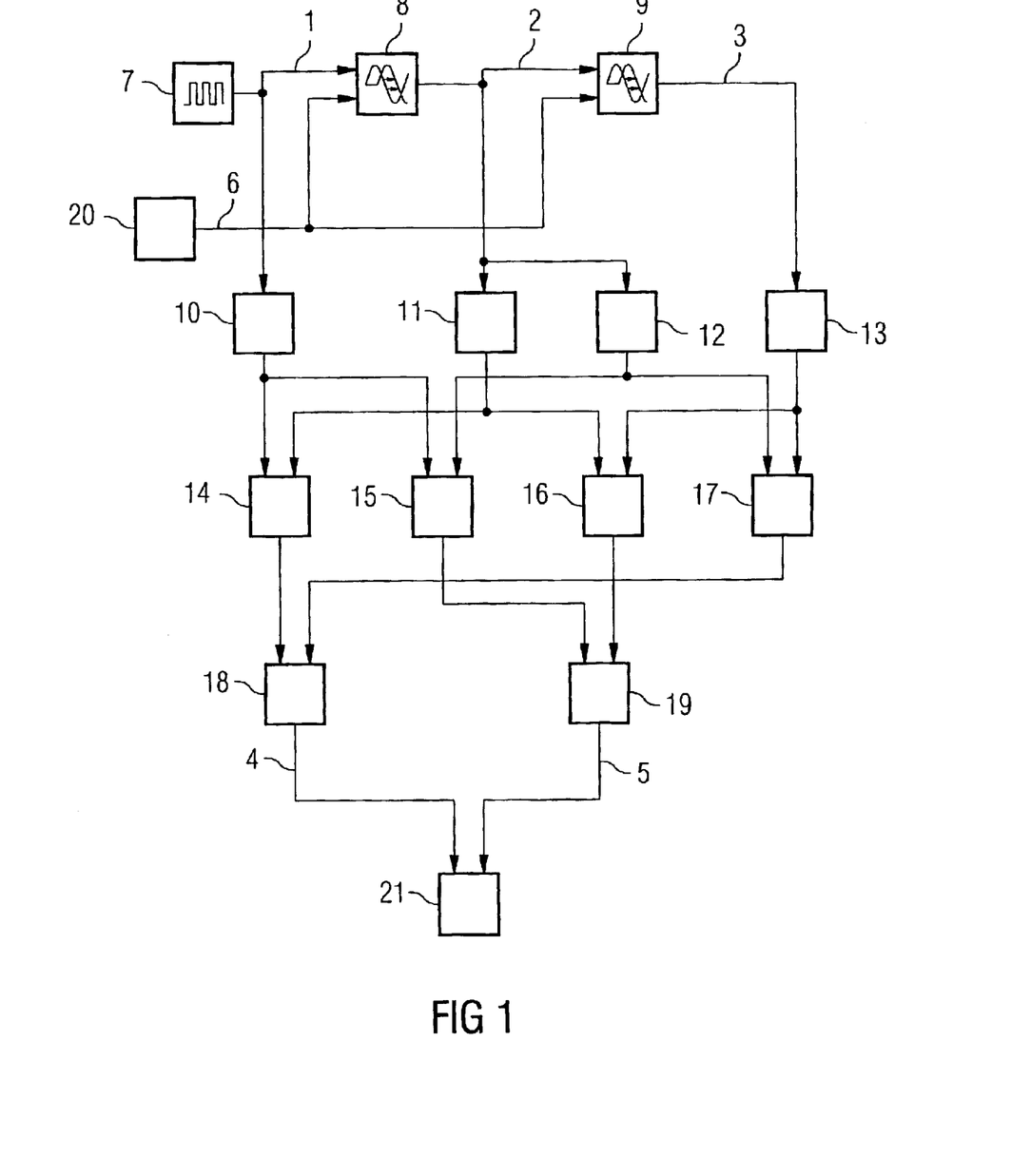
FIG. 1 shows the structure of a circuit arrangement for generating two phase control signals for driving two phase delay elements according to a first embodiment of the present invention.

The circuit arrangement illustrated in FIG. 1 includes two phase delay elements 8, 9 connected in series, the input of the first phase delay element 8 being supplied with an input signal 1, the input of the second phase delay element 9 being supplied with the first delay signal 2 which is present at the output of the first phase delay element 8, and a second delay signal 3 being present at the output of the second phase delay element 9. The input signal 1 comes from a signal source 7 not described in detail. Both phase delay elements 8, 9 are triggered by a corrective signal 6 which in turn is generated by a control system 20. As a function of the input signal 1 and the two delay signals 2, 3 two phase control signals 4, 5, which act on a charge pump 21, are generated by means of an arrangement of logic gates 10–19. The charge pump 21 is connected via a path (not illustrated) to the control system 20 so that a closed loop is produced. The two phase control signals 4, 5 are generated in all embodiments of the present invention in such a way that in the steady oscillating state both phase control signals 4, 5 adopt an active switching state for a certain duration. As soon as the phase delay of the two phase delay elements 8, 9 deviates from the reference phase delay, the durations of the active switching states of the two phase control signals 4, 5 change, whereby the charge pump 21 is triggered in a changed manner and an appropriate corrective signal 6 for eliminating the control difference can be generated by means of the control system 20.

The charge pump 21 is formed by a capacitor having two switchable current sources the voltage of which is the output signal of the charge pump 21 and is used to supply the control system 20. The capacitor of the charge pump is charged when the up signal is active and discharged when the down signal is active, so that the voltage at the capacitor is influenced by the relationship between the respective durations within which the two phase control signals 4, 5 are active.

Figure 4:
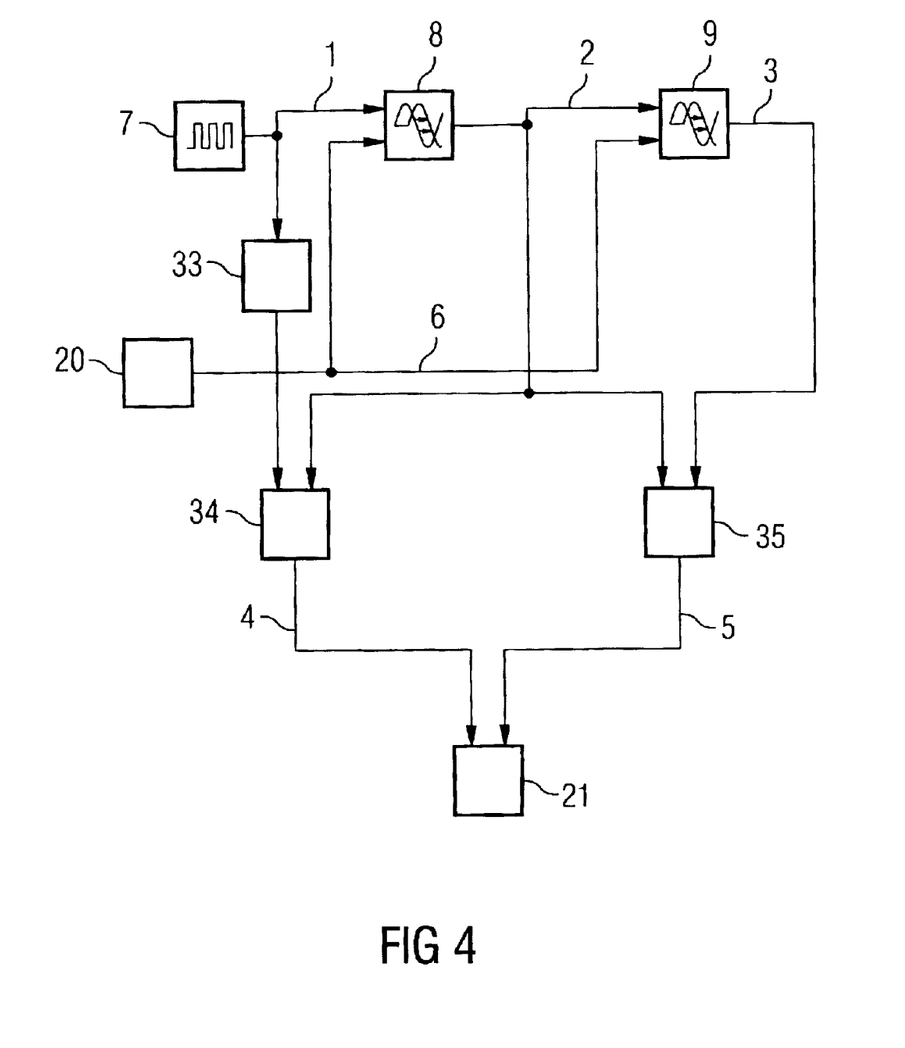
FIG. 4 shows the structure of a circuit arrangement for generating two phase control signals for driving two phase delay elements according to a fourth embodiment of the present invention.

Before discussing exact structure of the arrangement formed by the logic gates 10 to 19, the phase control signals 4, 5 generated as a result thereof of will be dealt with. In FIG. 4, the durations during which the two phase control signals 4, 5 adopt the active switching state are shown in a graph in relation to the period duration of the input signal 1 as a function of the phase delay of the two phase delay elements 8, 9. The up signal to raise the phase delay is represented by a broken line and the down signal to lower the phase delay of the two phase delay elements 8, 9 is shown by a dot-dash line. Also shown in the graph in FIG. 5 with an unbroken line is an effective signal dependent on the phase delay of the two phase delay elements 8, 9, the effective signal representing a measure for the effect of the two phase control signals 4, 5 together on the output signal of the charge pump 21.

In the first embodiment illustrated in FIG. 1, the reference phase difference is 0.25 times the period duration of the input signal 1. With this reference phase difference, the two phase control signals are in each case in their active switching state for 0.5 times the period duration of the input signal 1. Since both phase control signals 4, 5 are in their active switching state for equal durations the value 0 is yielded for the effective signal. Because the two phase control signals 4, 5 change by the same amount in opposite directions in case of a deviation of the phase delay of the two phase delay elements 8, 9 from the reference phase delay, the effective signal changes by twice as much as the two phase control signals 4, 5 taken separately.

Figure 5:
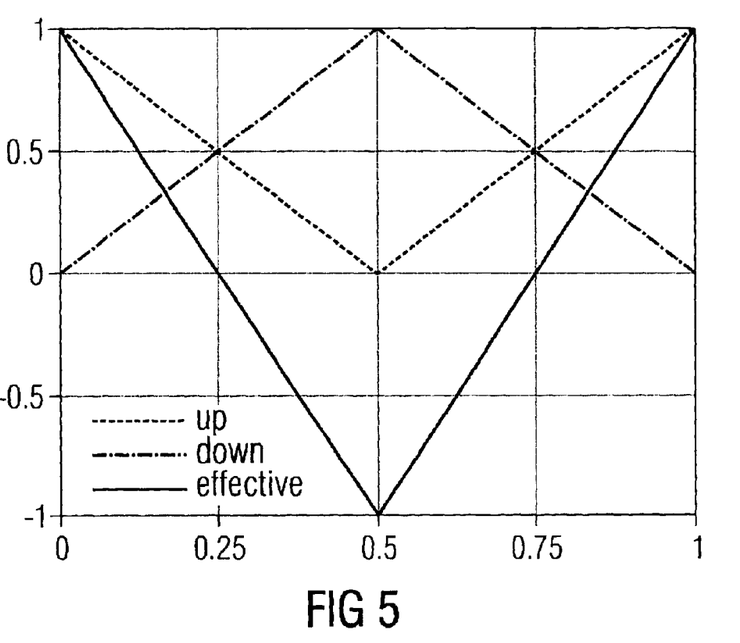
FIG. 5 shows the durations of the active switching states of the two phase control signals and an effective corrective signal resulting there from as a function of the phase delay of the phase delay elements in the circuit arrangement according to FIG. 1.

To obtain the behavior illustrated in the graph in FIG. 5, the following possibilities exist for the arrangement of the logic gates 10–19, the relationship of the phase delay of the phase delay elements 8, 9 to the period duration of the input signal 1 being plotted towards the right in the graphs of FIGS. 5 to 8, and the relationship of the durations of the active switching states of the up and down signals and of the effective signal to the period duration of input signal 1 being plotted towards the top:

1a) Logic gates 11 and 13 are simple transitions or drivers, logic gates 10 and 12 are negation elements, logic gates 14–19 are AND elements.
1b) Logic gates 11 and 13 are transitions or drivers, logic gates 10 and 12 are negation elements, logic gates 14–19 are NOR elements.
1c) Logic gates 11 and 13 are simple transitions or drivers, logic gates 10 and 12 are negation elements, logic gates 14–17 are AND elements, logic gates 18 and 19 are OR elements.
1d) Logic gates 11 and 13 are transitions or drivers, logic gates 10 and 12 are negation elements, logic gates 14–17 are OR elements, logic gates 18 and 19 are AND elements.
1e) Logic gates 12 and 13 are simple transitions or drivers, logic gates 10 and 11 are negation elements, logic gates 14 to 19 are NAND elements.
1f) Logic gates 10 and 11 are simple transitions or drivers, logic gates 12 and 13 are negation elements, logic gates 14 to 19 are NAND elements.
1g) Logic gates 10 and 12 are simple transitions or drivers, logic gates 11 and 13 are negation elements, logic gates 14–19 are NAND elements.

In the case of possibilities 1a) to 1g), the following allocations are yielded for the corrective effect of the two phase control signals 4, 5: in the case of possibilities 1a), 1c) and 1g) the phase control signal 4 is the down signal and the phase control signal 5 the up signal, whereas in the case of possibilities 1b), 1d), 1e) and 1f) the phase control signal 4 is the up signal and the phase control signal 5 the down signal.

Using the above-mentioned possibilities of executing the first embodiment of the present invention the following switching behavior for the up signal and the down signal as a function of the switching states of the input signal 1 and the two delay signals 2, 3 can be obtained.

| Input signal (1) | First delay signal (2) | Second delay signal (3) | First phase control signal (4) | Second phase control signal (5) |
|---|---|---|---|---|
| Possibilities 1a) to 1e) | | | | |
| 1 | 1 | 1 | 1 | 0 |
| 0 | 1 | 1 | 1 | 1 |
| 1 | 0 | 1 | 0 | 1 |
| 0 | 0 | 1 | 1 | 1 |
| 1 | 1 | 0 | 0 | 0 |
| 0 | 1 | 0 | 0 | 1 |
| 1 | 0 | 0 | 0 | 0 |
| 0 | 0 | 0 | 1 | 0 |
| Possibilities 1f) and 1g) | | | | |
| 1 | 1 | 1 | 1 | 0 |
| 0 | 1 | 1 | 0 | 0 |
| 1 | 0 | 1 | 0 | 1 |
| 0 | 0 | 1 | 0 | 0 |
| 1 | 1 | 0 | 1 | 1 |
| 0 | 1 | 0 | 0 | 1 |
| 1 | 0 | 0 | 1 | 1 |
| 0 | 0 | 0 | 1 | 0 |

Figure 2:
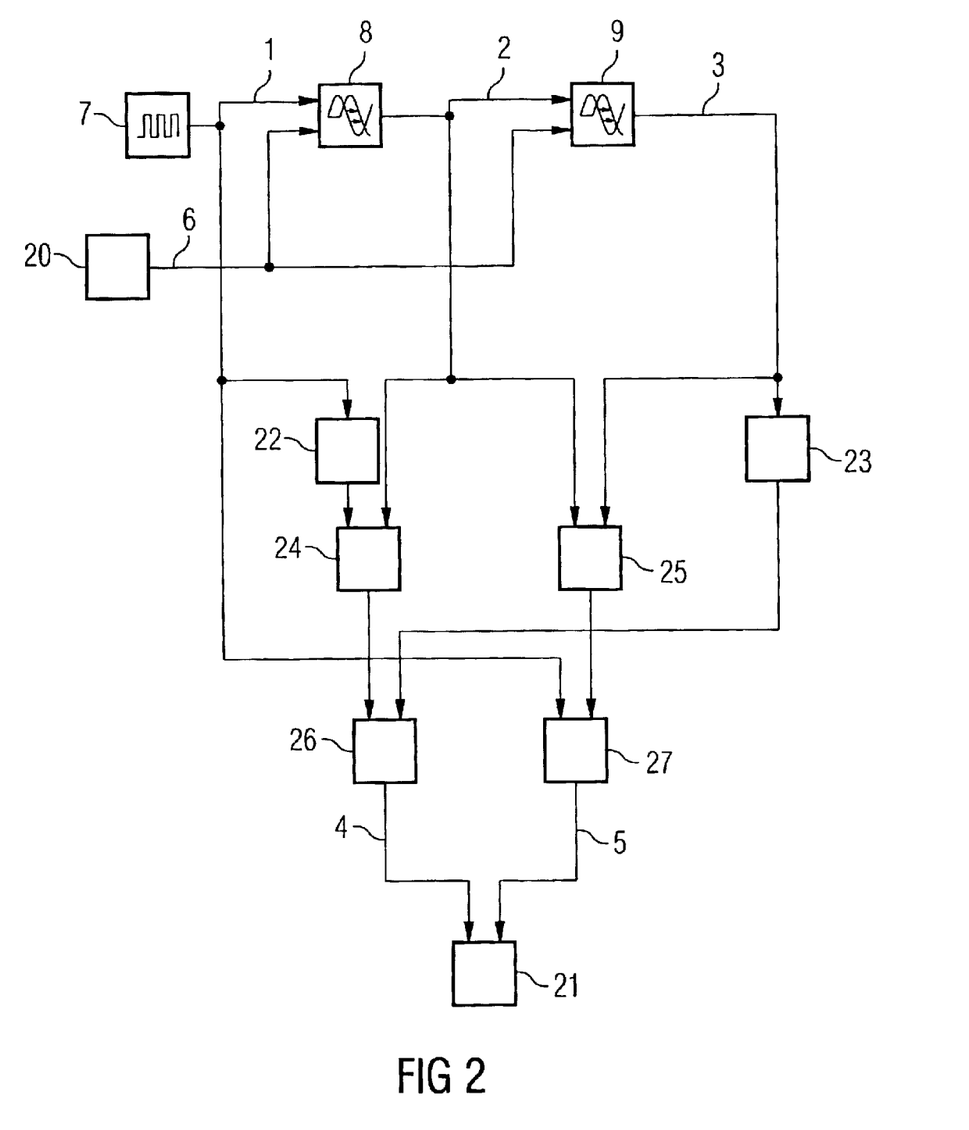
FIG. 2 shows the structure of a circuit arrangement for generating two phase control signals for driving two phase delay elements according to a second embodiment of the present invention.

A second embodiment of the present invention, for the realization of which a reduced number of logic gates is advantageously required, is illustrated in FIG. 2. The single difference from the first embodiment consists in the circuit arrangement of logic gates 22 to 27 between the input signal 1, the two delay signals 2, 3 and the two phase control signals 4, 5. In the second embodiment, as in the first, there are a plurality of possibilities for selecting the logic gates 22 to 27, the allocation of the up signal and the down signal to the two phase control signals 4, 5 changing as a function of the selected logic gates 22 to 27.

2a) Logic gates 22 and 23 are negation elements, logic gates 24 to 27 are NAND elements, phase control signal 4 is the down signal and phase control signal 5 is the up signal.
2b) Logic gates 22 and 23 are negation elements, logic gates 24 to 27 are NOR elements, phase control signal 4 is the up signal and phase control signal 5 is the down signal.

Figure 3:
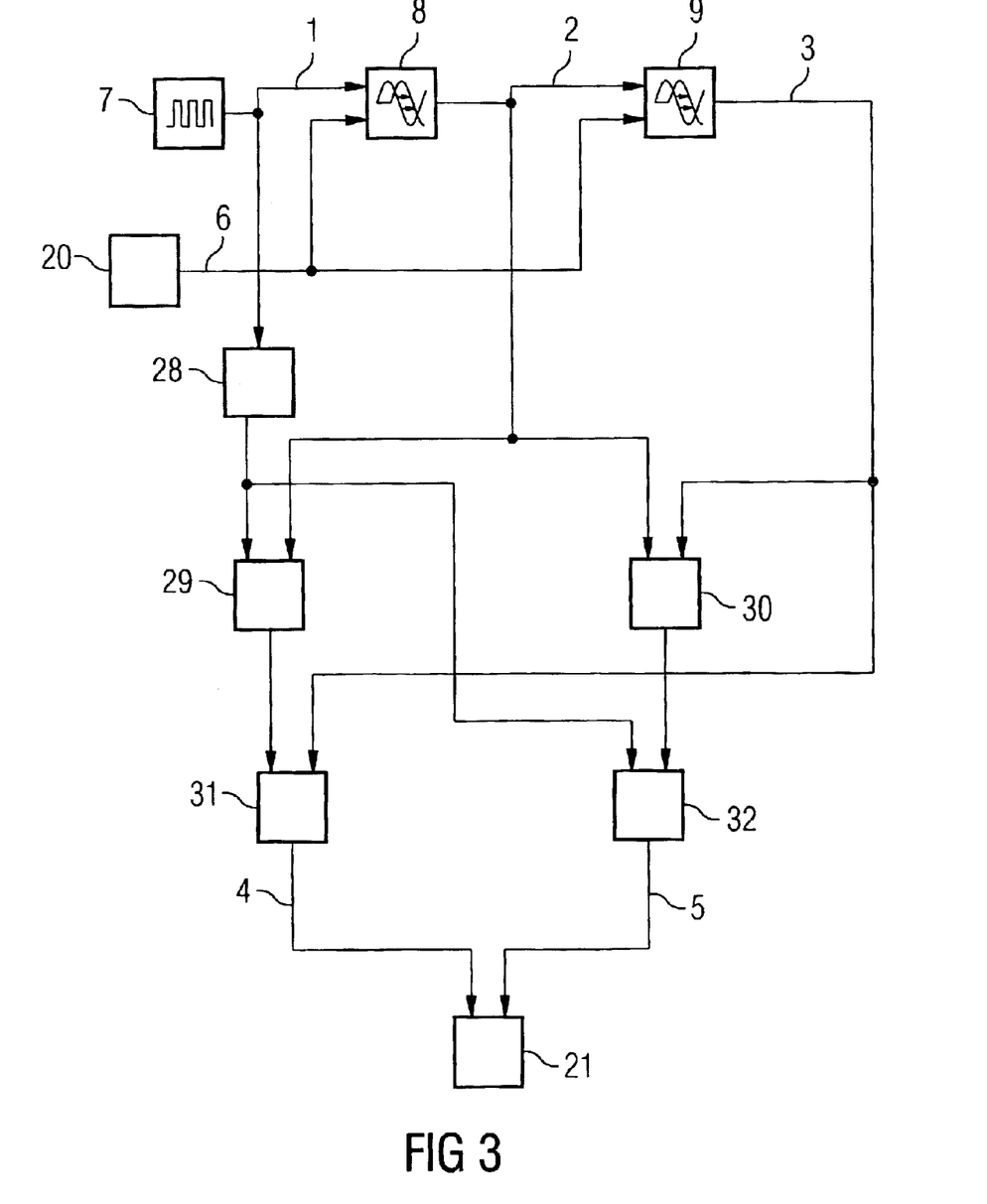
FIG. 3 shows the structure of a circuit arrangement for generating two phase control signals for driving two phase delay elements according to a third embodiment of the present invention.

In FIG. 3, a third embodiment of the present invention is illustrated which likewise requires an advantageously small number of logic gates 28 to 32. Like the second embodiment, the third embodiment differs from the first solely with regard to the circuit arrangement of the logic gates 28 to 32 between the input signal 1, the two delay signals 2, 3 and the two phase control signals 4, 5. The following possibilities exist for selecting logic gates 28 to 32:

3a) Logic gate 28 is a negation element, logic gates 29 and 30 are AND elements, logic gates 31 and 32 are OR elements, phase control signal 4 is the down signal and phase control signal 5 is the up signal.

3b) Logic gate 28 is a negation element, logic gates 29 and 30 are OR elements, logic gates 31 and 32 are AND elements, phase control signal 4 is the up signal and phase control signal 5 is the down signal.

Figure 6:
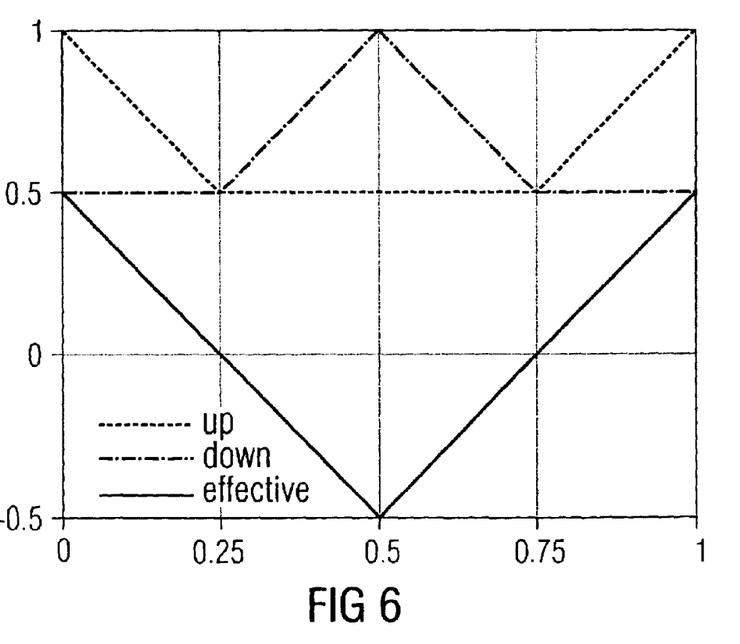
FIG. 6 shows the durations of the active switching states of the two phase control signals and an effective corrective signal resulting there from as a function of the phase delay of the phase delay elements in the circuit arrangement according to FIG. 2.
Figure 7:
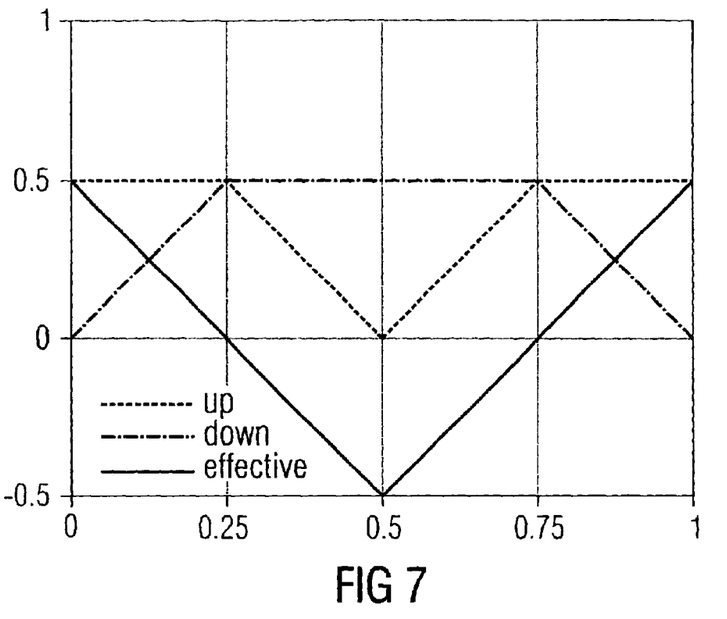
FIG. 7 shows the durations of the active switching states of the two phase control signals and an effective corrective signal resulting there from as a function of the phase delay of the phase delay elements in the circuit arrangement according to FIG. 3.

The phase control signals 4, 5 generated by means of the second and third embodiments and the resulting effective signal are represented in FIGS. 6 and 7.

The signals represented in the graph according to FIG. 6 correspond to an inventive device according to possibilities 2a) and 3a), whereas the signals represented in the graph according to FIG. 7 correspond to the inventive device according to possibilities 2b) and 3b).

In the case of the signals represented in the graph according to FIG. 6, it should be noted that, independently of the phase delay, the up signal and the down signal are in the active switching state at least for 0.5 times the period duration of the input signal 1. In case of a deviation of the phase delay from the reference phase delay, however, only one phase control signal 4, 5 changes while the other phase control signal 4, 5 remains at the value of 0.5 times the period duration. If, for example, the phase delay falls below the reference phase delay the down signal remains at 0.5 times the period duration of input signal 1 and the up signal rises. In case of an upward deviation of the phase delay, the up signal remains at 0.5 times the period duration of input signal 1 and the down signal rises.

In the case of the signals represented in the graph according to FIG. 7, it should be noted that the up signal and the down signal adopt their active switching state independently of the phase delay for at most 0.5 times the period duration of input signal 1. In the case of a deviation of the phase delay from the reference phase delay again only one of the two phase control signals 4, 5 is reduced while the other phase control signal 4, 5 remains at the value of 0.5 times the period duration of input signal 1.

Using the different possibilities for realizing the second and third embodiments of the present invention, the following switching functions of the up signal and the down signal can be generated as a function of input signal 1 and the two delay signals 2, 3.

| Input signal (1) | First delay signal (2) | Second delay signal (3) | First phase control signal (4) | Second phase control signal (5) |
|---|---|---|---|---|
| Possibilities 2a) and 3a) | | | | |
| 1 | 1 | 1 | 1 | 1 |
| 0 | 1 | 1 | 1 | 1 |
| 1 | 0 | 1 | 0 | 1 |
| 0 | 0 | 1 | 1 | 1 |
| 1 | 1 | 0 | 0 | 0 |
| 0 | 1 | 0 | 1 | 1 |
| 1 | 0 | 0 | 0 | 0 |
| 0 | 0 | 0 | 1 | 0 |
| Possibilities 2b) and 3b) | | | | |
| 1 | 1 | 1 | 1 | 0 |
| 0 | 1 | 1 | 1 | 1 |
| 1 | 0 | 1 | 0 | 0 |
| 0 | 0 | 1 | 1 | 1 |
| 1 | 1 | 0 | 0 | 0 |
| 0 | 1 | 0 | 0 | 1 |
| 1 | 0 | 0 | 0 | 0 |
| 0 | 0 | 0 | 0 | 0 |

In FIG. 4, a fourth embodiment of the present invention is represented in which the two phase control signals 4, 5 are generated advantageously with only three logic gates 33–35. The single difference from the first embodiment consists in the circuit section for generating the two phase control signals 4, 5 from input signal 1 and the two delay signals 2 and 3. The two following possibilities exist for selecting the logic gates 33–35:

4a) Logic gate 33 is a negation element and the two logic gates 34 and 35 are AND elements, phase control signal 4 is the down signal and phase control signal 5 is the up signal.

4b) Logic gate 33 is a negation element and the two logic gates 34 and 35 are NOR elements, phase control signal 4 is the up signal and phase control signal 5 is the down signal.

Figure 8:
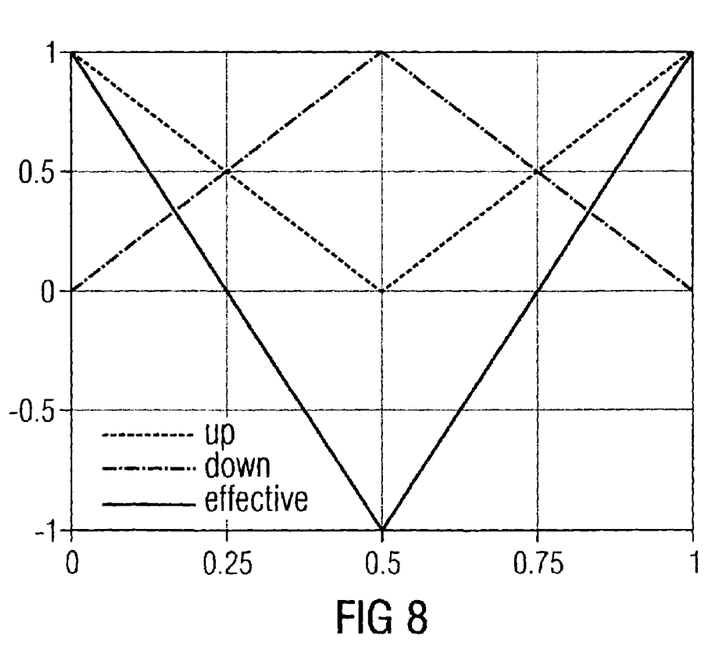
FIG. 8 shows the durations of the active switching states of the two phase control signals and an effective corrective signal resulting there from as a function of the phase delay of the phase delay elements in the circuit arrangement according to FIG. 4.

The phase control signals 4, 5 or the up and down signals corresponding thereto generated by means of the fourth embodiment, together with the resulting effective signal, are represented in FIG. 8.

In this embodiment, the up signal and the down signal in the steady oscillating state are in each case in the active switching state for one-quarter of the period duration of input signal 1. In case of a deviation of the phase delay of the two phase delay elements 8, 9 the two phase control signals 4, 5 change in opposite directions. The behavior of the two phase control signals 4, 5 therefore corresponds to that in the first embodiment, with the difference that the phase control signals 4, 5 in the steady oscillating state are in the active state not for one-half but only for one-quarter of the period duration of input signal 1.

By means of the two possibilities for the fourth embodiment of the present invention, the following switching functions of the up signal and the down signal can be generated as a function of input signal 1 and the two delay signals 2, 3.

| Input signal (1) | First delay signal (2) | Second delay signal (3) | Up signal (4, 5) | Down signal (4, 5) |
|---|---|---|---|---|
| Possibility 4a) | | | | |
| 1 | 1 | 1 | 1 | 0 |
| 0 | 1 | 1 | 1 | 1 |
| 1 | 0 | 1 | 0 | 0 |
| 0 | 0 | 1 | 0 | 0 |
| 1 | 1 | 0 | 0 | 0 |
| 0 | 1 | 0 | 0 | 1 |
| 1 | 0 | 0 | 0 | 0 |
| 0 | 0 | 0 | 0 | 0 |
| Possibility 4b) | | | | |
| 1 | 1 | 1 | 0 | 0 |
| 0 | 1 | 1 | 0 | 0 |
| 1 | 0 | 1 | 1 | 0 |
| 0 | 0 | 1 | 0 | 0 |

-continued

| Input signal (1) | First delay signal (2) | Second delay signal (3) | Up signal (4, 5) | Down signal (4, 5) |
|---|---|---|---|---|
| 1 | 1 | 0 | 0 | 0 |
| 0 | 1 | 0 | 0 | 0 |
| 1 | 0 | 0 | 1 | 1 |
| 0 | 0 | 0 | 0 | 1 |

Using the method or the device according to the invention, a phase detection system is advantageously possible which supplies a signal having the correct polarity, provided the delay in the whole chain of phase delay elements 8, 9 is less than three times the delay in the nominal steady oscillating state. Moreover, provided the delay in the chain of phase delay elements 8, 9 is less than twice the delay in the nominal steady oscillating state, the resulting output signal of the phase detector 21 is advantageously proportional to the error in the delay.

The numerous possibilities of the different embodiments of the present invention described above show that a desired switching behavior of the two phase control signals 4, 5 as a function of input signal 1 and the two delay signals 2, 3 can be generated with very different circuit variants. For example, possibilities 1e)–1g) can be regarded as variants in which, on the basis of possibility 1a), the negation elements were placed at different points.

Corresponding variations are also possible on the basis of possibilities 1b)–1d). In addition, through an inversion of the output signals, the up signal and the down signal can be exchanged in each case. In case a differential logic is used the negation elements and inverters can be realized simply by exchanging the differential inputs or outputs of the gates.

Because, in the first embodiment, the duration of both the up signal and the down signal constantly changes, one of the two signals can also in principle be replaced by the input signal, suitably delayed if required, since the latter's switched-on duration constantly corresponds to one-half of the period duration. Half the gates can thereby be saved, so that instead of six gates only three are needed.

Likewise, possibilities 2a), 2b), 3a) and 3b) are derived from possibilities 1a)–1d). Further variants corresponding to possibilities 1e)–1g) in which, on the basis of possibilities 2a), 2b), 3a) and 3b), other signals are inverted, are, of course, possible. Through inversion of the output signals the up signal and the down signal can be exchanged in this case, too, a lengthening of the switched-on duration becoming a shortening and vice versa.

Likewise, in the device according to the fourth embodiment of the present invention, the up signal and the down signal can be exchanged by inverting the two phase control signals 4, 5. In this case, in the steady oscillating state the two phase control signals 4, 5 would be in the active switching state for three-quarters of the period duration and the minimal duration in which the two phase control signals 4, 5 are in the active switching state would be half the period duration.

Unlike the case with possibilities 1a)–1g), in the case of possibilities 2a), 2b), 3a), 3b), 4a) and 4b) phase control signals 4, 5 are not symmetrical to each other but constantly overlap completely. Further variations in which, in a manner similar to that in possibilities 1e)–1g), other incoming signals tapped from the chain of phase delay elements 8, 9 are inverted are, of course, also possible with these variants.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for controlling two phase delay elements connected in series, comprising the steps of:
    (a) providing first and second delay elements;
    (b) supplying an input signal to the input of the first delay element;
    (c) generating a first delay signal at the output of the first delay element;
    (d) generating a second delay signal at the output of the second delay element;
    (e) providing a first phase control signal as a function of the input signal and the first and second delay signals, said first phase control signal being an up signal which in an active switching state raises the phase delay of the first and second delay elements;
    (f) providing a second phase control signal as a function of the input signal and the first and second delay signals, said second phase control signal being a down signal which in an active second state decreases the phase delay of the first and second delay elements;
    said first and second phase control signals operating such that the first and second phase control signals adopt their active switching state in each period of the input signal for at least one-quarter of the period duration of said input signal.

2. A method according to claim 1, wherein the two phase control signals are generated in such a way that the durations in which the two phase control signals adopt their active switching state are symmetrical to one another in time.

3. A method according to claim 1, wherein in case of a deviation of the phase delay of the two phase delay elements from a reference phase delay, the durations in which the two phase control signals adopt their active switching state change in opposite directions.

4. A method according to claim 1, wherein in case of a deviation of the phase delay of the two phase delay elements from a reference phase delay, the first or second phase control signal remains constant and the other of the first or second phase control signal is raised.

5. A method according to claim 1, wherein in case of a deviation of the phase delay of the two phase delay elements from a reference phase delay, the first or second phase control signal remains constant and the other of the first or second phase control signal is lowered.

6. A method according to claim 1, wherein a reference phase delay of the two phase delay elements amounts to one-quarter of the period duration of the input signal.

7. A method according to claim 1, wherein in case of reference phase delay of both phase delay elements, the first and second phase control signals adopt their active switching state in each period of the input signal for one-half of the period duration of the input signal.

8. A method according to claim 7, wherein the two phase control signals are generated according to the relationship

| Input signal (1) | First delay signal (2) | Second delay signal (3) | Up signal (4, 5) | Down signal (4, 5) |
|---|---|---|---|---|
| 1 | 1 | 1 | 1 | 0 |
| 0 | 1 | 1 | 1 | 1 |
| 1 | 0 | 1 | 0 | 1 |
| 0 | 0 | 1 | 1 | 1 |
| 1 | 1 | 0 | 0 | 0 |

-continued

| Input signal (1) | First delay signal (2) | Second delay signal (3) | Up signal (4, 5) | Down signal (4, 5) |
| --- | --- | --- | --- | --- |
| 0 | 1 | 0 | 0 | 1 |
| 1 | 0 | 0 | 0 | 0 |
| 0 | 0 | 0 | 1 | 0 | where a 1 corresponds to a first or active switching state and a 0 to a second or non-active switching state.

9. A method according to claim 7, wherein the two phase control signals are generated according to the relationship

| Input signal (1) | First delay signal (2) | Second delay signal (3) | Up signal (4, 5) | Down signal (4, 5) |
| --- | --- | --- | --- | --- |
| 1 | 1 | 1 | 1 | 0 |
| 0 | 1 | 1 | 0 | 0 |
| 1 | 0 | 1 | 0 | 1 |
| 0 | 0 | 1 | 0 | 0 |
| 1 | 1 | 0 | 1 | 1 |
| 0 | 1 | 0 | 0 | 1 |
| 1 | 0 | 0 | 1 | 1 |
| 0 | 0 | 0 | 1 | 0 | where a 1 corresponds to a first or active switching state and a 0 to a second or non-active switching state.

10. A method according to claim 7, wherein the two phase control signals are generated according to the relationship

| Input signal (1) | First delay signal (2) | Second delay signal (3) | Up signal (4, 5) | Down signal (4, 5) |
| --- | --- | --- | --- | --- |
| 1 | 1 | 1 | 1 | 1 |
| 0 | 1 | 1 | 1 | 1 |
| 1 | 0 | 1 | 0 | 1 |
| 0 | 0 | 1 | 1 | 1 |
| 1 | 1 | 0 | 0 | 0 |
| 0 | 1 | 0 | 1 | 1 |
| 1 | 0 | 0 | 0 | 0 |
| 0 | 0 | 0 | 1 | 0 | where a 1 corresponds to a first or active switching state and a 0 to a second or non-active switching state.

11. A method according to claim 7, wherein the two phase control signals are generated according to the relationship

| Input signal (1) | First delay signal (2) | Second delay signal (3) | Up signal (4, 5) | Down signal (4, 5) |
| --- | --- | --- | --- | --- |
| 1 | 1 | 1 | 1 | 0 |
| 0 | 1 | 1 | 1 | 1 |
| 1 | 0 | 1 | 0 | 0 |
| 0 | 0 | 1 | 1 | 1 |
| 1 | 1 | 0 | 0 | 0 |
| 0 | 1 | 0 | 0 | 1 |
| 1 | 0 | 0 | 0 | 0 |
| 0 | 0 | 0 | 0 | 0 | where a 1 corresponds to a first or active switching state and a 0 to a second or non-active switching state.

12. A method according to claim 1, wherein in case of reference phase delay of both phase delay elements, the first and second phase control signals adopt their active switching state in each period of the input signal for one-quarter of the period duration of the input signal.

13. A method according to claim 12, wherein the two phase control signals are generated according to the relationship

| Input signal (1) | First delay signal (2) | Second delay signal (3) | Up signal (4, 5) | Down signal (4, 5) |
| --- | --- | --- | --- | --- |
| 1 | 1 | 1 | 1 | 0 |
| 0 | 1 | 1 | 1 | 1 |
| 1 | 0 | 1 | 0 | 0 |
| 0 | 0 | 1 | 0 | 0 |
| 1 | 1 | 0 | 0 | 0 |
| 0 | 1 | 0 | 0 | 1 |
| 1 | 0 | 0 | 0 | 0 |
| 0 | 0 | 0 | 0 | 0 | where a 1 corresponds to a first or active switching state and a 0 to a second or non-active switching state.

14. A method according to claim 12, wherein the two phase control signals are generated according to the relationship

| Input signal (1) | First delay signal (2) | Second delay signal (3) | Up signal (4, 5) | Down signal (4, 5) |
| --- | --- | --- | --- | --- |
| 1 | 1 | 1 | 0 | 0 |
| 0 | 1 | 1 | 0 | 0 |
| 1 | 0 | 1 | 1 | 0 |
| 0 | 0 | 1 | 0 | 0 |
| 1 | 1 | 0 | 0 | 0 |
| 0 | 1 | 0 | 0 | 0 |
| 1 | 0 | 0 | 1 | 1 |
| 0 | 0 | 0 | 0 | 1 | where a 1 corresponds to a first or active switching state and a 0 to a second or non-active switching state.

15. A device for parallel control of two phase delay elements, a second phase delay element being connected in series with a first delay element, such that when an input signal is supplied to the input of the first delay element, a first delay signal generated by the first delay element is supplied to the second phase delay element, a second delay signal being generated by the second phase delay element; said device comprising:
a control arrangement, said control arrangement generating a first phase control signal and a second phase control signal as a function of the input signal and the first and second delay signals, the first phase control signal being an up signal which in an active switching state raises the phase delay of both phase delay elements, and the second phase control signal being a down signal which in the active switching state decreases the phase delay of both phase delay elements; such that the first and second phase control signals adopt their active switching state in each period of the input signal for at least one-quarter of the period duration of the input signal.

16. A device according to claim 15, wherein the control arrangement generates the two phase control signals through logical connection of the input signal and the two delay signals to one another.

17. A device according to claim 16, wherein the control arrangement is built up from gate units.

18. A device according to claim 15, wherein the control arrangement is a programmable logic device.

* * * * *